United States Patent
Su et al.

(10) Patent No.: US 10,043,882 B2
(45) Date of Patent: Aug. 7, 2018

(54) METHOD OF FORMING SEMICONDUCTOR DEVICE

(71) Applicant: UNITED MICROELECTRONICS CORP., Hsin-Chu (TW)

(72) Inventors: Po-Wen Su, Kaohsiung (TW); Zhen Wu, Kaohsiung (TW); Hsiao-Pang Chou, Taipei (TW); Chiu-Hsien Yeh, Tainan (TW); Shui-Yen Lu, Tainan (TW); Jian-Wei Chen, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/863,990

(22) Filed: Jan. 8, 2018

(65) Prior Publication Data

US 2018/0151685 A1    May 31, 2018

Related U.S. Application Data

(62) Division of application No. 15/182,620, filed on Jun. 15, 2016, now Pat. No. 9,899,491.

(30) Foreign Application Priority Data

May 16, 2016    (TW) .............................. 105115025 A

(51) Int. Cl.
| | |
|---|---|
| *H01L 29/51* | (2006.01) |
| *H01L 29/40* | (2006.01) |
| *H01L 29/423* | (2006.01) |
| *H01L 21/82* | (2006.01) |
| *H01L 21/8234* | (2006.01) |

(Continued)

(52) U.S. Cl.
CPC ...... *H01L 29/512* (2013.01); *H01L 21/82345* (2013.01); *H01L 21/823462* (2013.01); *H01L 27/088* (2013.01); *H01L 29/401* (2013.01); *H01L 29/4236* (2013.01); *H01L 29/66545* (2013.01)

(58) Field of Classification Search
CPC .................................................. H01L 21/82345
USPC ........................................................ 257/392
See application file for complete search history.

(56) References Cited

U.S. PATENT DOCUMENTS

| | | |
|---|---|---|
| 8,772,168 B2 | 7/2014 | Xie |
| 2010/0052067 A1 | 3/2010 | Hsu |
| 2011/0079828 A1 | 4/2011 | Anderson |

(Continued)

OTHER PUBLICATIONS

Liu, Title of Invention: Semiconductor Device and Method of Forming the Same, U.S. Appl. No. 15/046,458, filed Feb. 18, 2016.

(Continued)

*Primary Examiner* — Moazzam Hossain
*Assistant Examiner* — Omar Mojaddedi
(74) *Attorney, Agent, or Firm* — Winston Hsu

(57) ABSTRACT

A method of forming a semiconductor device includes the following steps. A substrate is provided, and the substrate has a first region. A barrier layer is then formed on the first region of the substrate. A first work function layer is formed on the barrier layer. An upper half portion of the first work function layer is converted into a non-volatile material layer. The non-volatile material layer is removed and a lower half portion of the first work function layer is kept.

5 Claims, 13 Drawing Sheets

(51) Int. Cl.
    *H01L 27/088*     (2006.01)
    *H01L 29/66*     (2006.01)

(56) References Cited

U.S. PATENT DOCUMENTS

| | | | |
|---|---|---|---|
| 2011/0298062 A1* | 12/2011 | Ganguli | H01L 21/28079 257/410 |
| 2013/0154021 A1 | 6/2013 | Chuang | |
| 2015/0243563 A1* | 8/2015 | Lee | H01L 21/82345 257/392 |
| 2015/0243658 A1 | 8/2015 | Joshi | |

OTHER PUBLICATIONS

Hung, Title of Invention: Semiconductor Structure, U.S. Appl. No. 14/880,275, filed Oct. 11, 2015.
Lin, Title of Invention: Method of Using Polysilicon as Stop Layer in a Replacement Metal Gate Process, U.S. Appl. No. 15/161,294, filed May 23, 2016.

\* cited by examiner

METHOD OF FORMING SEMICONDUCTOR DEVICE

CROSS REFERENCE TO RELATED APPLICATIONS

This application is a division of application Ser. No. 15/182,620 filed on Jun. 15, 2016, now allowed, which is incorporated by reference herein in its entirety.

BACKGROUND OF THE INVENTION

1. Field of the Invention

The present invention relates to a semiconductor device and a method of forming the same, and more particularly, to a semiconductor device having transistors with different threshold voltages (Vth) and a method of forming the same.

2. Description of the Prior Art

In traditional semiconductor industry, poly-silicon is conventionally used as a standard material for a gate electrode in semiconductor devices, such as the metal-oxide-semiconductor (MOS). With the trend towards scaling down the size of semiconductor devices, however, conventional poly-silicon gates face problems such as inferior performance due to boron penetration and unavoidable depletion effect. This increases equivalent thickness of the gate dielectric layer, reduces gate capacitance, and worsens a driving force of the devices. Therefore, new materials for gate filling are developed in the related industry. For example, work function metals that are suitable for use with a high dielectric constant (high-k) gate dielectric layer are used to replace the conventional poly-silicon gate as the control electrode.

In addition, with the trend towards scaling down the size of field effect transistors (hereinafter abbreviated as FETs), the development of the conventional planar FETs faces process limitations. For overcome the process limitations, non-planar transistor technology such as fin field effect transistor (hereinafter abbreviated as FinFET) technology has become the mainstream to replace the planar transistors. Generally, in the conventional planar metal gate transistors, the threshold voltage of the transistor is modified by the ion implantation process. However, in the processes of the FinFET, the threshold voltage of the transistor cannot be modified simply by the ion implantation process, and it is an important task to figure out how to improve this disadvantage in the FinFET configuration.

SUMMARY OF THE INVENTION

It is one of the objectives of the present invention to provide a method of forming a semiconductor device. Fluoride plasma and a patterned mask are employed in a treatment process for forming a non-volatile material layer in a part of an upper half portion of a work function layer. Subsequently, gate structures in the same gate trench may have work function layers with different thicknesses by removing the non-volatile material layer completely, and transistors having different threshold voltages may then be formed accordingly.

It is another one of the objectives of the present invention to provide a semiconductor device including gate structures surrounded by one identical spacer. The gate structures have work function layers with different thicknesses, and the transistors formed by the gate structures may have different threshold voltages and improved device performance may be achieved.

To achieve the purposes described above, a semiconductor device is provided in one embodiment of the present invention. The semiconductor device includes a substrate, a first gate structure, and a second gate structure. The first gate structure and the second gate structure are disposed on the substrate. The first gate structure includes a barrier layer, a first work function layer, a second work function layer and a conductive layer stacked one over another sequentially on the substrate. The second gate structure includes the barrier layer, a portion of the first work function layer and the conductive layer stacked one over another sequentially on the substrate. The portion of the first work function layer has a smaller thickness than a thickness of the first work function layer.

To achieve the purposes described above, a method of forming a semiconductor device is provided in another embodiment of the present invention. The method includes the following steps. A substrate is provided, and the substrate has a first region. A barrier layer is then formed on the first region of the substrate. A first work function layer is formed on the barrier layer. An upper half portion of the first work function layer is converted into a non-volatile material layer. The non-volatile material layer is removed and a lower half portion of the first work function layer is kept.

In the present invention, a non-volatile material layer is formed in a part of an upper half portion of a work function layer by a treatment process using a patterned mask and fluoride plasma, and the non-volatile material layer is removed completely in the subsequent process. Accordingly, the relatively thinner work function layer (such as about 10 angstroms) may be further thinned in the present invention, and transistor structures of the same conductivity type may have different threshold voltages because of the work function layers with different thicknesses. The method of the present invention may be used to remove the upper half portion of the work function layer uniformly and conformally without completely removing the work function layer. The lower half portion of the work function layer may still be kept and become a thinned work function layer. Therefore, the method of the present invention may be used to form transistors, such as an N-type transistor or a P-type transistor, with standard threshold voltage, low threshold voltage, or ultra-low threshold voltage in semiconductor devices.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-9 are schematic drawings illustrating a method of forming a semiconductor device according to a first embodiment of the present invention, wherein FIG. 1 is a top-view diagram illustrating a semiconductor device in a beginning of the method;

FIG. 2 is a cross-sectional diagram taken along a line A-A' and a line a-a' in FIG. 1;

FIG. 3 is a cross-sectional diagram taken along a line B-B' and a line b-b' in FIG. 1;

FIG. 4 is a schematic cross-sectional diagram illustrating a semiconductor device after a step of forming gate trenches;

FIG. 5 is a schematic cross-sectional diagram illustrating a semiconductor device after a step of forming a bottom barrier layer;

FIG. 6 is a schematic cross-sectional diagram illustrating a semiconductor device after a treatment process;

FIG. 7 is a schematic cross-sectional diagram illustrating a semiconductor device after a step of removing a part of a work function layer;

FIG. 8 is a schematic cross-sectional diagram illustrating a semiconductor device after a step of forming a conductive layer; and FIG. 9 is a schematic cross-sectional diagram illustrating a semiconductor device after a planarization process.

FIGS. 10-13 are schematic drawings illustrating a method of forming a semiconductor device according to a second embodiment of the present invention, wherein FIG. 10 is a schematic cross-sectional diagram illustrating a semiconductor device after a step of partially removing a dummy gate electrode;

FIG. 11 is a schematic cross-sectional diagram illustrating a semiconductor device after an oxygen treatment process;

FIG. 12 is a schematic cross-sectional diagram illustrating a semiconductor device after a step of removing a part of a spacer; and FIG. 13 is a schematic cross-sectional diagram illustrating a semiconductor device after steps of forming a bottom barrier layer, a work function layer, and a conductive layer.

DETAILED DESCRIPTION

To provide a better understanding of the present invention to users skilled in the technology of the present invention, embodiments are detailed as follows. The embodiments of the present invention are illustrated in the accompanying drawings with numbered elements to clarify the contents and effects to be achieved.

Figure 1:
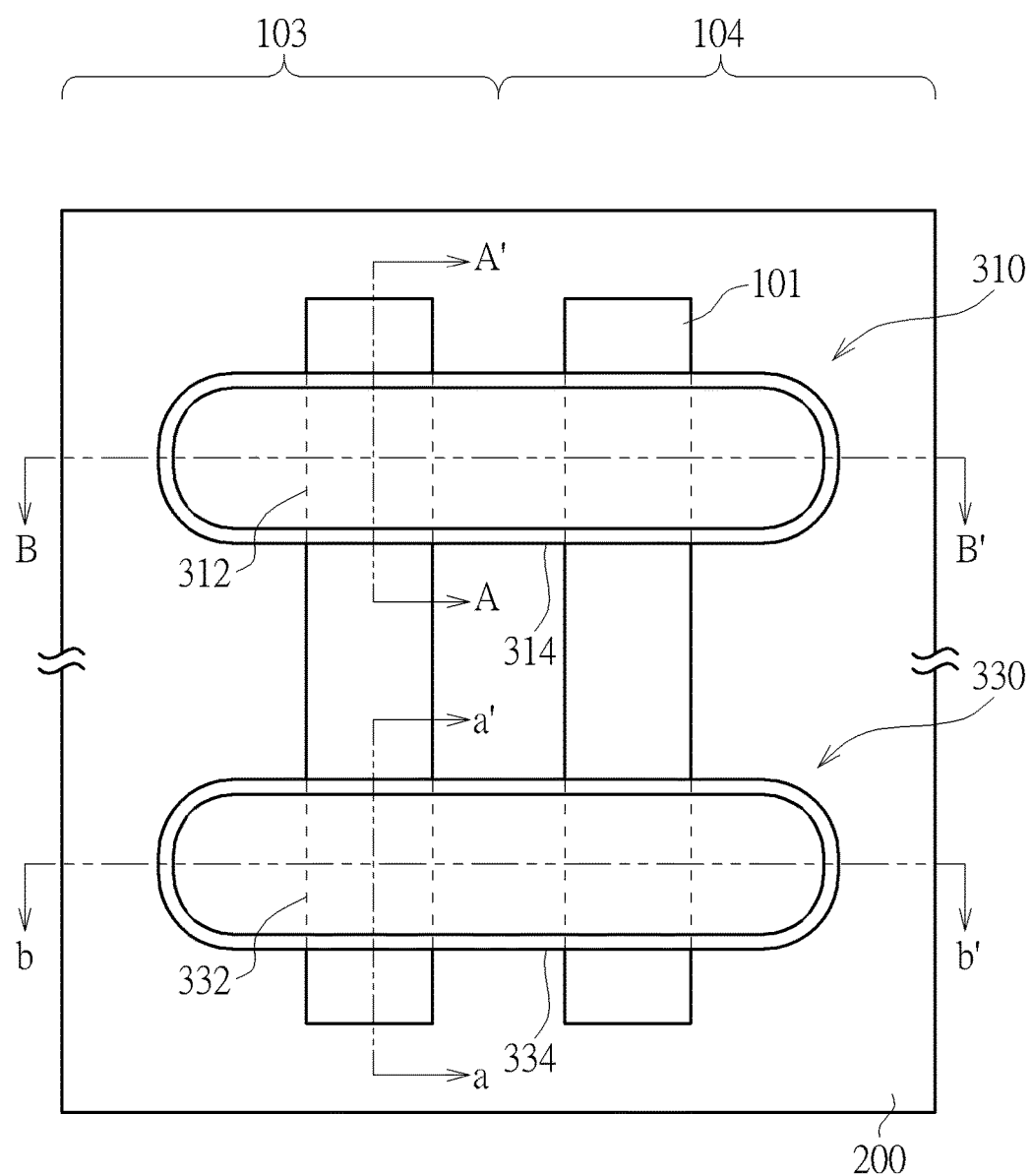

Please refer to FIGS. 1-9. FIGS. 1-9 are schematic drawings illustrating a method of forming a semiconductor device according to a first embodiment of the present invention. A substrate 100 is provided first. The substrate 100 may be semiconductor substrate, such as a silicon substrate, a silicon-containing substrate, or a silicon-on-insulator (SOI) substrate. At least one transistor region, such as a transistor region 103 and a transistor region 104 shown in FIG. 1, is defined on the substrate 100. A shallow trench isolation (STI) 102 is formed on the substrate 100 for defining at least one active area (AA) 101 in the transistor region 103 and the transistor region 104 respectively. The transistor region 103 and the transistor region 104 may be transistor regions for the same conductivity type, such as NMOS transistor regions, but not limited thereto. In another embodiment, the transistor region 103 and the transistor region 104 may be transistor regions for different conductivity types, such as an NMOS transistor region and a PMOS transistor region respectively.

Subsequently, at least one gate structure is formed on the substrate 100, such as gate structures 310 and 330 formed straddling the transistor regions 103 and 104 as shown in FIG. 1. The gate structures 310 and 330 include gate dielectric layers 311 and 331 respectively, dummy gate electrodes 312 and 332 respectively, a cap layer (not shown), and spacers 314 and 334 respectively. The gate dielectric layer 311 and the gate dielectric layer 331 may include silicon oxide ($SiO_2$) or silicon nitride (SiN). The dummy gate electrode 312 and the dummy gate electrode 332 may be polysilicon, such as an undoped polysilicon material, a doped polysilicon material, an amorphous silicon material, or a combination of the materials mentioned above. The spacer 314 and the spacer 334 may be single layer or multiple layer structures including high temperature oxide (HTO), silicon nitride, silicon oxide, silicon oxynitride, or silicon nitride formed by hexachlorodisilane ($Si_2Cl_6$) (HCD-SiN).

Figure 2:
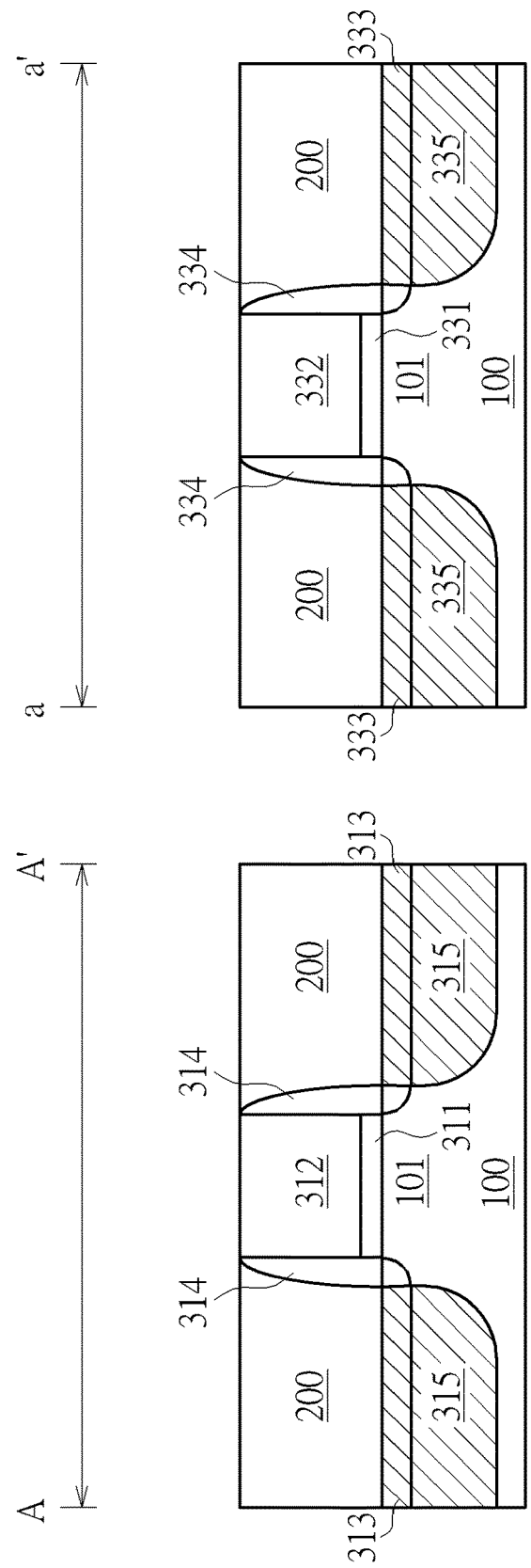
Figure 3:
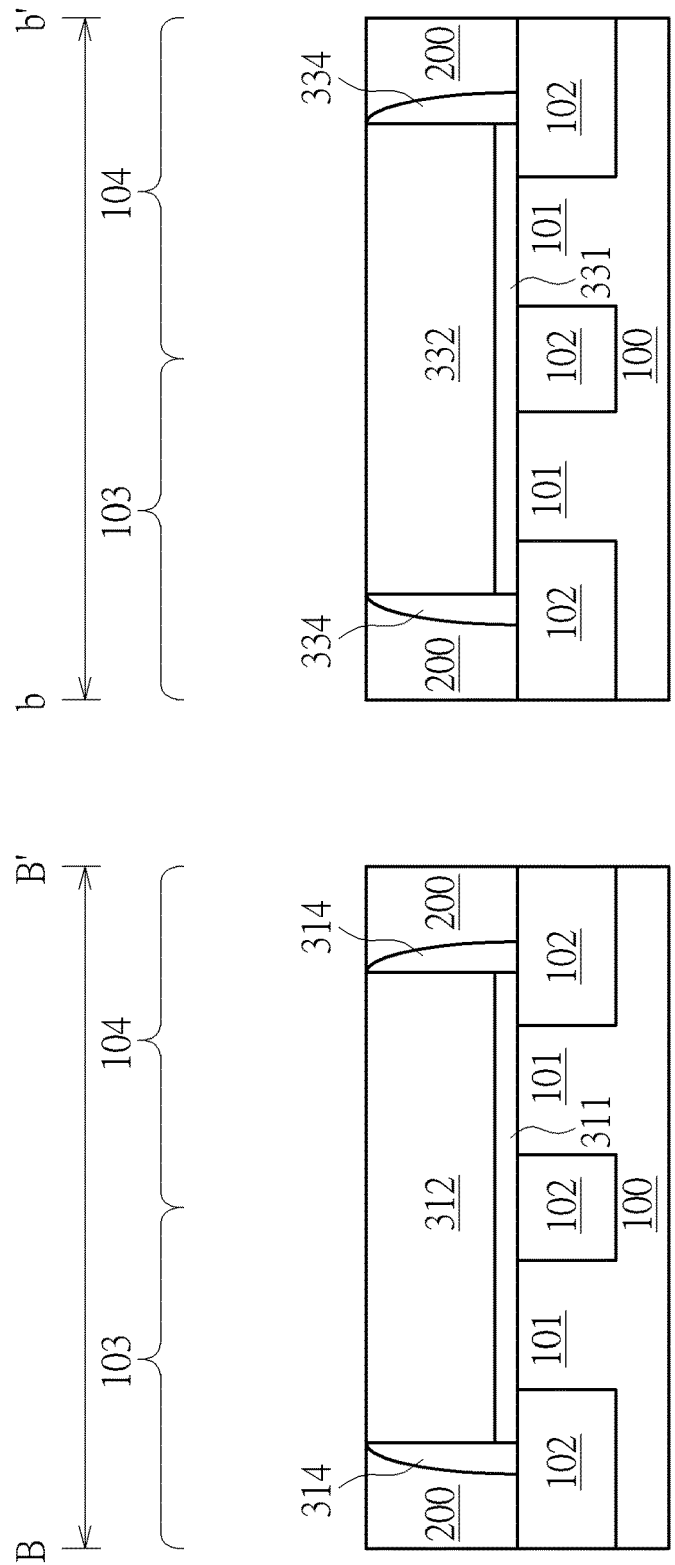

In one embodiment, a method of forming the gate structures 310 and 330 may include the following steps for example. A gate dielectric material layer (not shown), a dummy gate material layer (not shown), and a cap material layer (not shown) are formed completely on the substrate 100, and the stacked material layers are patterned for forming a gate stacked structure (not shown) on the active area 11 of the transistor region 103 and the active area 11 of the transistor region 104. Two lightly doped source/drain 313 and 333 are formed in the substrate 100 at two sides of the gate stacked structure, and a spacer material layer (not shown) is formed to cover the gate stacked structure and the substrate 100. An etching process is then performed on the space material layer for forming the spacers 314 and 334 surrounding the gate stacked structure respectively. At last, as shown in FIG. 2, two source/drain electrodes 315 and 335 are formed in the substrate 100 at two sides of the spacers 314 and 334 respectively. However, it should be realized for those skilled in the related field that the gate structure in the present invention may be formed by other processes and is not limited to the above-mentioned process steps. For example, in another embodiment of the present invention, at least one fin structure (not shown) may be formed in the substrate before the step of forming the gate structure straddling the fin structure, or a metal gate structure (not shown) at least including a work function layer and a metal gate may be formed directly on the substrate 100. Additionally, in other embodiments, the amount and the arrangement of the gate structures and the transistor regions may be different and are not limited to the condition shown in FIG. 1 an FIG. 2.

Figure 4:
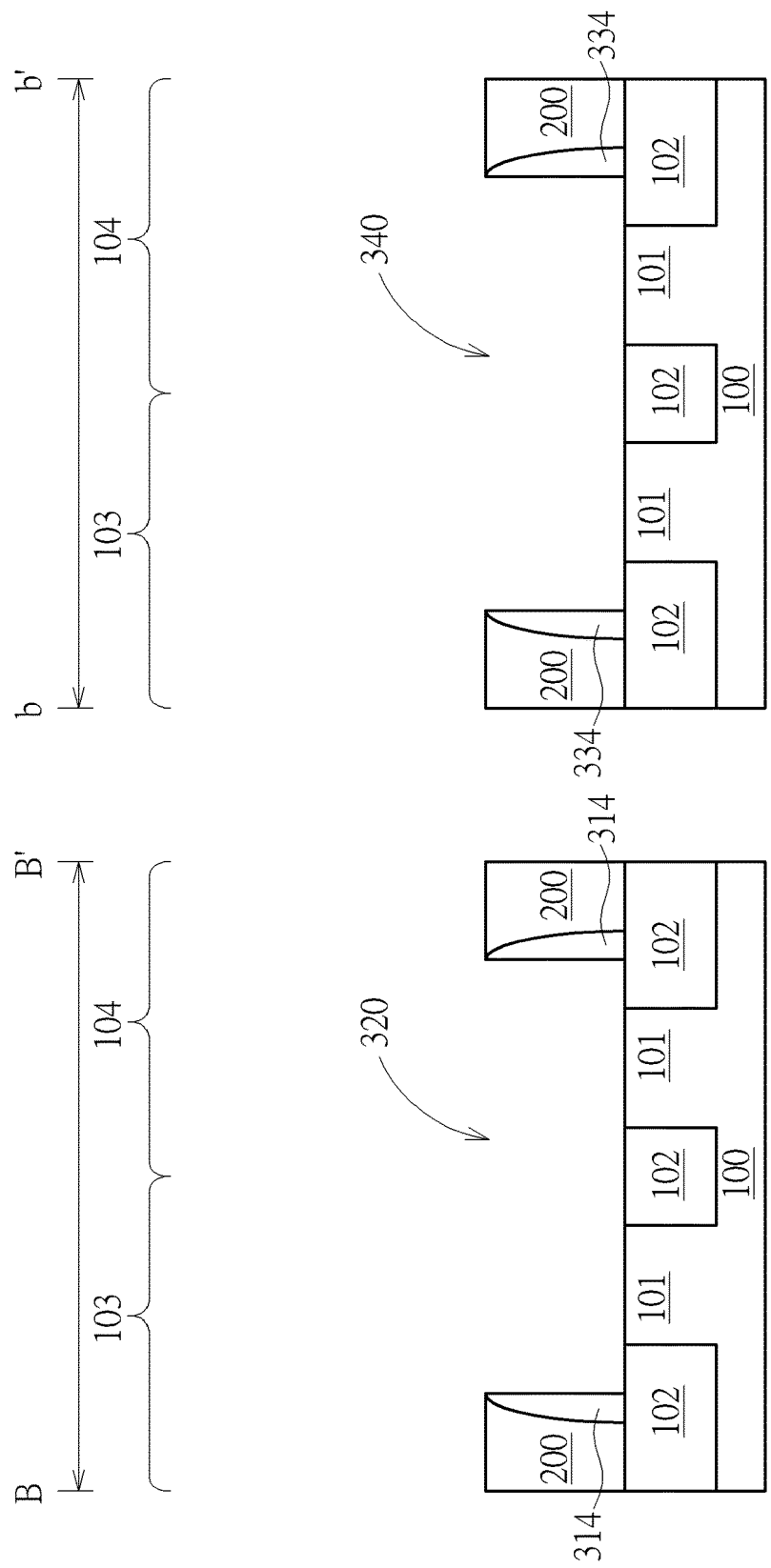

Subsequently, a contact etching stop layer (CESL, not shown) and an interlayer dielectric 200 are formed to cover the substrate 100 and the gate structures 310 and 330, and a replacement metal gate process is performed. In one embodiment of the replacement metal gate process, a planarization process, such as a chemical mechanical polishing (CMP) process, and an etching process, such as a dry etching process or a wet etching process, are employed to remove the cap layer of the gate structures 310 and 330, the dummy gate electrodes 312 and 332, and the gate dielectric layers 311 and 331 sequentially for forming two gate trenches 320 and 340 in the interlayer dielectric 200 as shown in FIG. 4.

Figure 5:
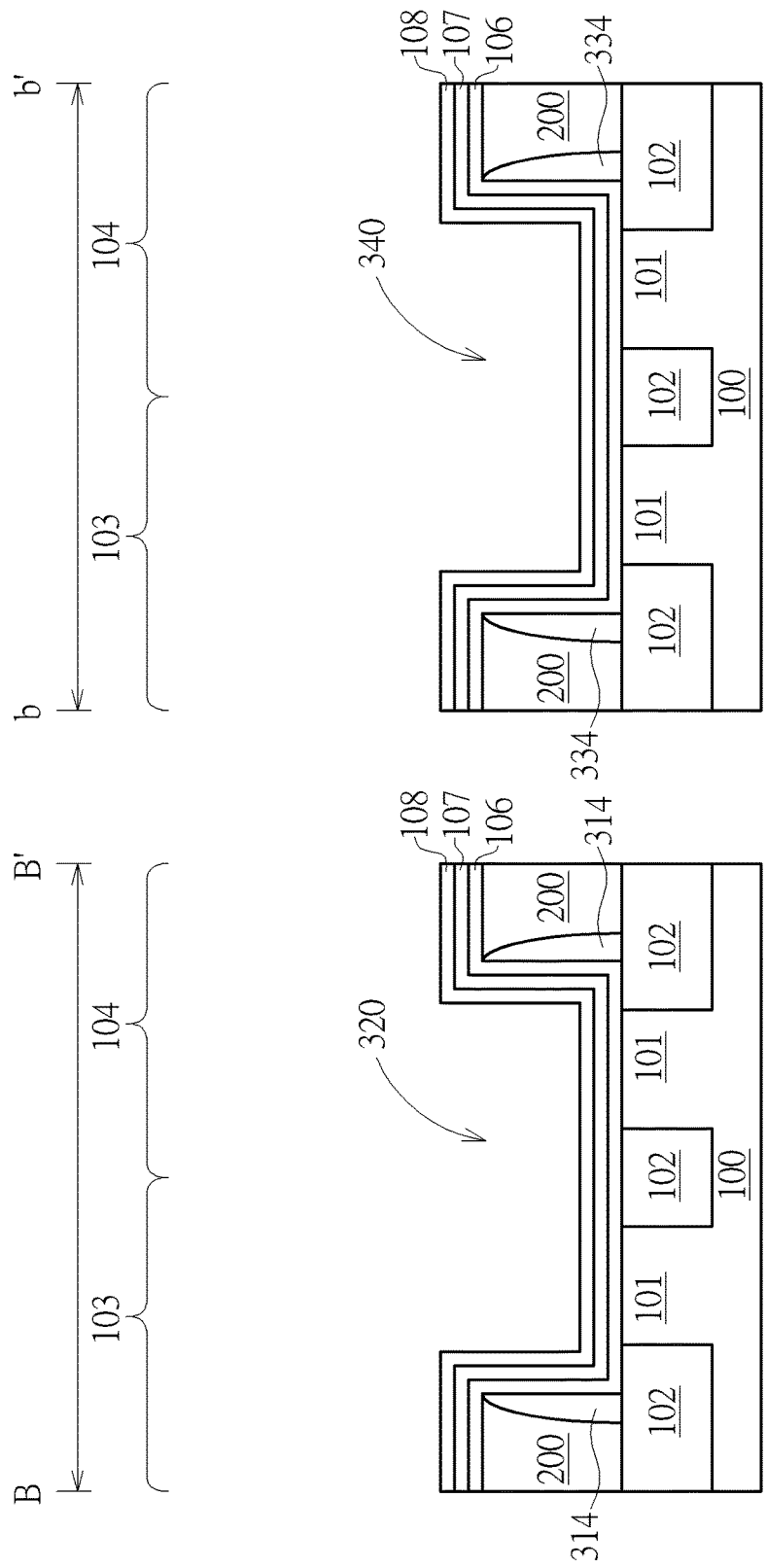

As shown in FIG. 5, an interfacial layer (not shown), a high-k dielectric (HK) layer 106, a bottom barrier layer 107, and a first work function layer 108 are sequentially formed on the substrate 100 and formed in the gate trenches 320 and 340. The interfacial layer may include silicon oxide, silicon nitride, or silicon oxynitride. The HK layer 106 may include dielectric materials with dielectric constant higher than 4, such as hafnium oxide ($HfO_2$) or aluminum oxide ($Al_2O_3$). The bottom barrier layer 107 may include titanium nitride (TiN). The work function layer 107 may be an N-type work function layer preferably, such as a composition including tantalum nitride (TaN). Accordingly, the bottom barrier layer 107 may also be used as a protection layer in the subsequent removing process for keeping the HK layer 106 from being damaged.

Subsequently, a part of the first work function layer 108 in the gate trench 320 is removed for thinning the portion of the first work function layer in the transistor region 104.

Figure 6:
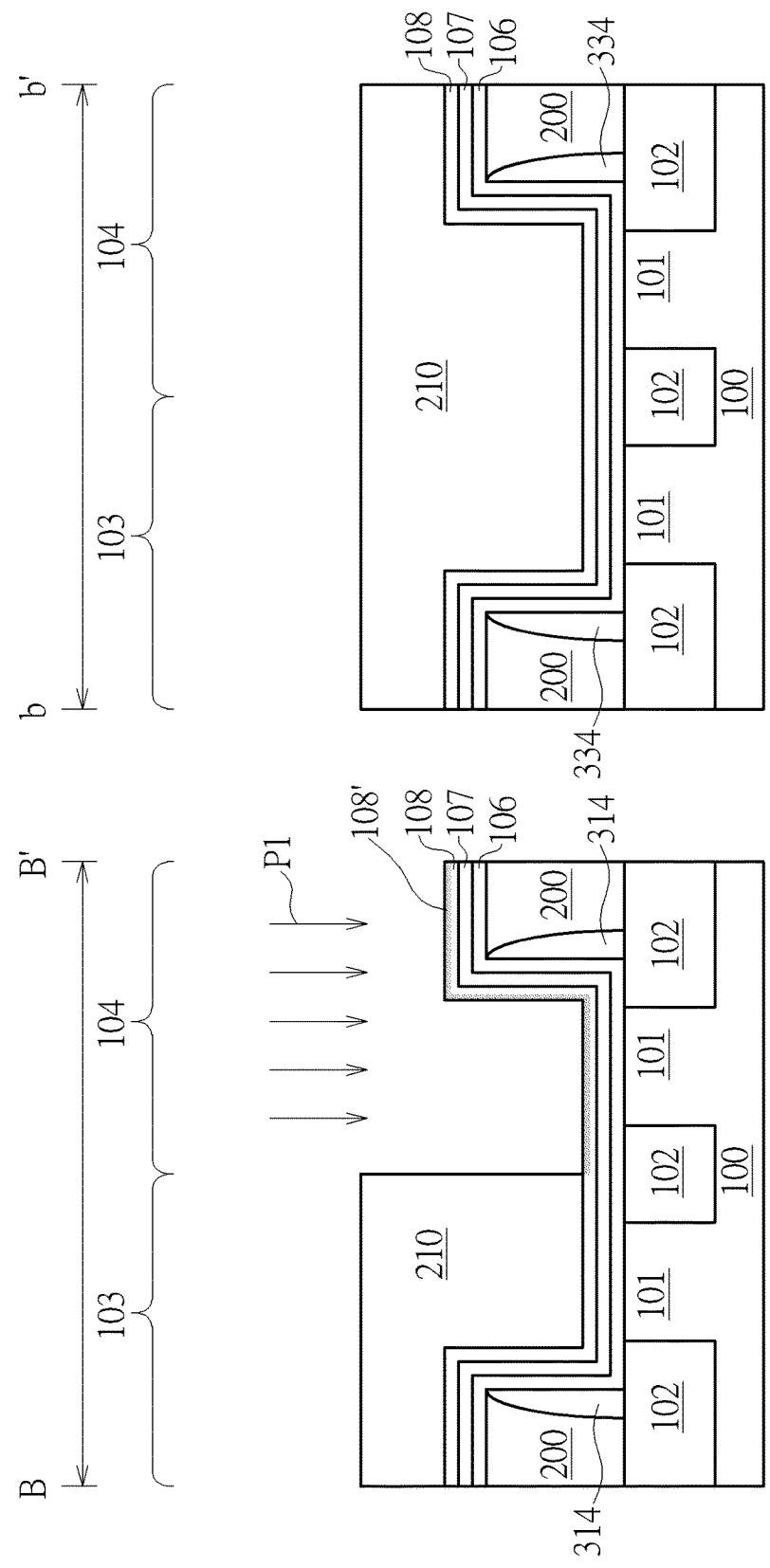
Figure 7:
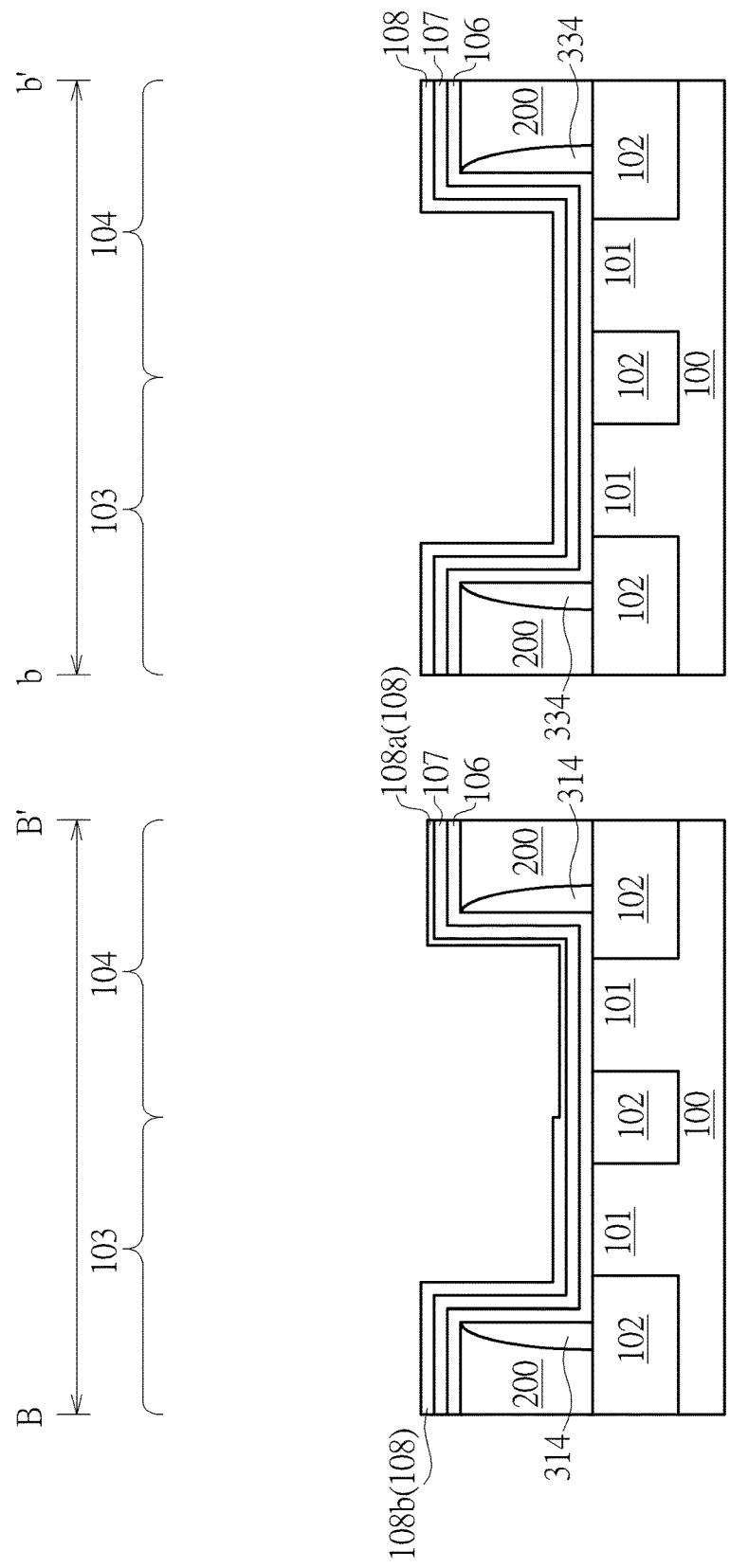

Specifically, in this embodiment, a patterned mask, such as a patterned photoresist layer 210, is formed first for covering most parts of the substrate 100 and exposing the first work function layer 108 in the transistor region 104 and in the gate trench 320, as shown in FIG. 6. A treatment process P1 is then performed to introduce fluoride plasma (F plasma) for generating reactions with the first work function layer 108 and converting the exposed upper half portion of the first work function layer into a non-volatile material layer 108', such as tantalum fluoride ($TaF_5$). For example, the treatment process P1 may be performed in a condition with the temperature ranges between 10° C. and 100° C., 25° C.±20° C., or a condition at 15° C. preferably, and the process apparatus introduces gas including nitrogen trifluoride ($NF_3$), tetrafluoromethane ($CF_4$) and/or sulfur (VI) fluoride ($SF_6$) by power ranging between 500 Watts and 1000 Watts for generating reactions with the tantalum nitride of the first work function layer 108 by about 100 seconds to 140 seconds, and 15 second preferably for forming a non-volatile material layer 108', which is tantalum fluoride ($TaF_5$). Subsequently, the non-volatile material layer 108' and the patterned photoresist layer 210 are removed completely for forming a thinned first work function layer 108a, which is an unremoved lower half portion of the first work function layer 108 as shown in FIG. 7.

It is worth noting that, in this embodiment, the fluoride plasma is introduced by relatively lower power and in the condition with relatively lower temperature, and the fluoride plasma will react with tantalum nitride and form a self-limited stop layer at the same time in this condition. Therefore, the fluoride plasma reacts only with the upper half portion of the tantalum nitride in the first work function layer 108 without further reacting downward. The non-volatile material layer 108' will be only formed in the upper half portion of the first work function layer 108 exposed in the transistor region 104, and the non-volatile material layer 108' may be completely removed by a specific etchant in the subsequent process. In addition, the fluoride plasma reacts with the first work function layer 108 uniformly and conformally, and the non-volatile material layer 108' will be formed uniformly on all exposed surface of the upper half portion of the first work function layer 108 and will not be formed only on the surface of the central part. The thickness of the non-volatile material layer 108' is uniform as shown in FIG. 6. Accordingly, a thinned first work function layer 108a may be formed in the exposed transistor region 104 by completely removing the non-volatile material layer 108' without exposing the bottom barrier layer 107 under the first work function layer 108, and the thickness of the thinned first work function layer 108a is uniform. For example, the thinned first work function layer 108a may have a thickness in the range of from 5 angstroms to 7 angstroms when the first work function layer 108 has a thickness in the range of from 10 angstroms to 13 angstroms, but not limited thereto. The thickness of the non-volatile material layer 108' is substantially related to the temperature range of the treatment process P1. Generally, the thickness of the non-volatile material layer 108' may be increased by about 0.5 angstrom when the temperature is increased by 10° C. In addition, a first work function layer 108b in the same gate trench 320 but located in the transistor region 103 will not be thinned at all, and the thickness of the first work function layer 108b may be kept in the original condition, such as between 10 angstroms and 13 angstroms.

Figure 8:
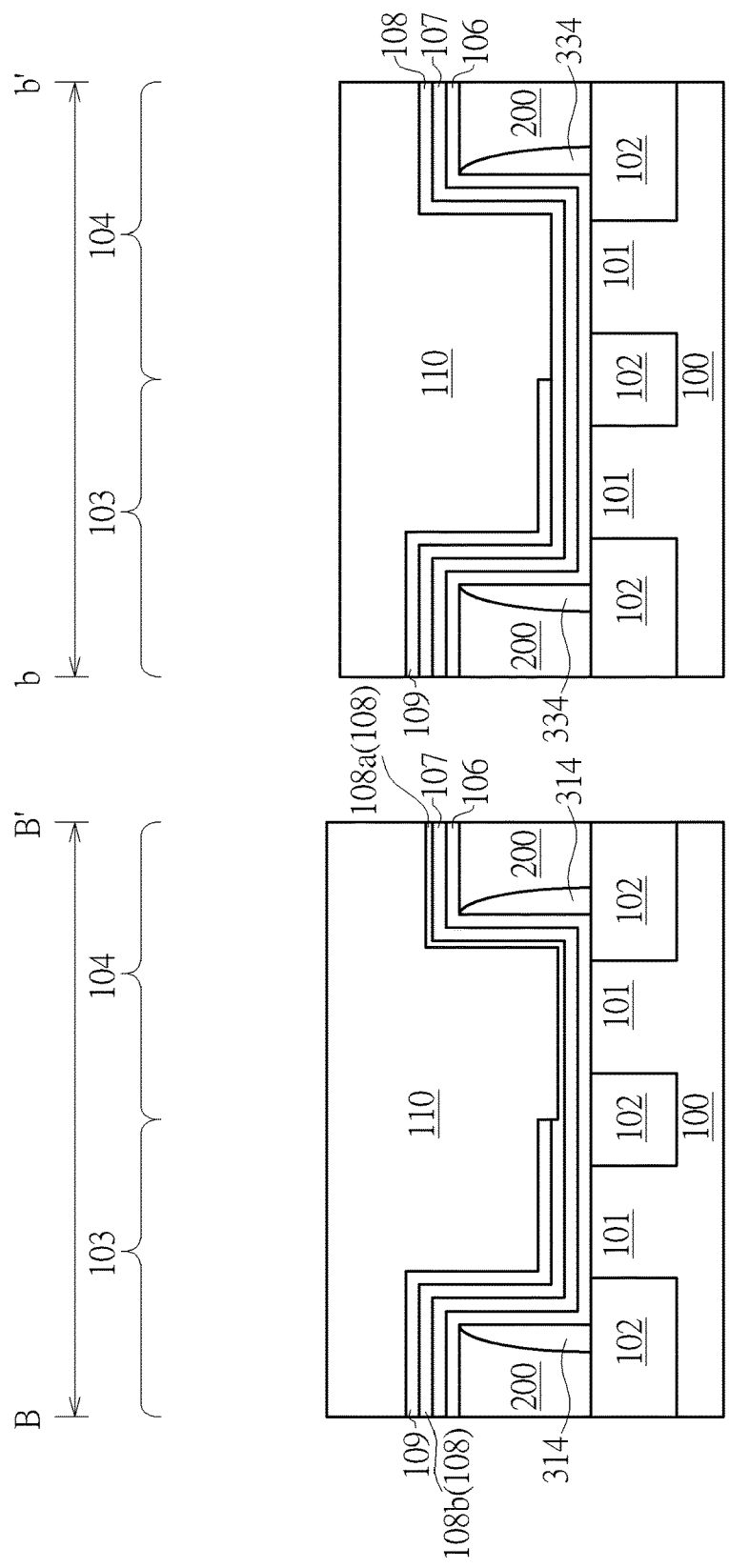

As shown in FIG. 8, a second work function layer 109 is then formed only in the transistor region 103, and the gate trenches 320 and 340 are filled with a low resistance material layer 110. For example, a forming method of the second work function layer 109 may include the following steps. A work function material layer (not shown) may be formed on the substrate 100 and cover the transistor region 103, the transistor region 104, and the substrate 100. A patterned mask, such as a patterned photoresist layer (not shown), may be formed for covering the transistor region 103 and exposing the transistor region 104. The patterned photoresist layer is then used to completely remove the work function material layer in the exposed transistor region 104 and expose the first work function layer 108 under the work function material layer for forming the work function layer 109 only in the transistor region 103 and in the gate trenches 320 and 340, as shown in FIG. 8. The patterned photoresist layer is then removed, and the low resistance material layer 110 is formed for filling the gate trenches 320 and 340 with the low resistance material layer 110. In one embodiment, the work function layer 109 may be a P-type work function layer, such as titanium nitride, and the low resistance material layer 110 may be metal materials such as aluminum (Al), tungsten (W), or titanium aluminide (TiAl), but not limited thereto.

Figure 9:
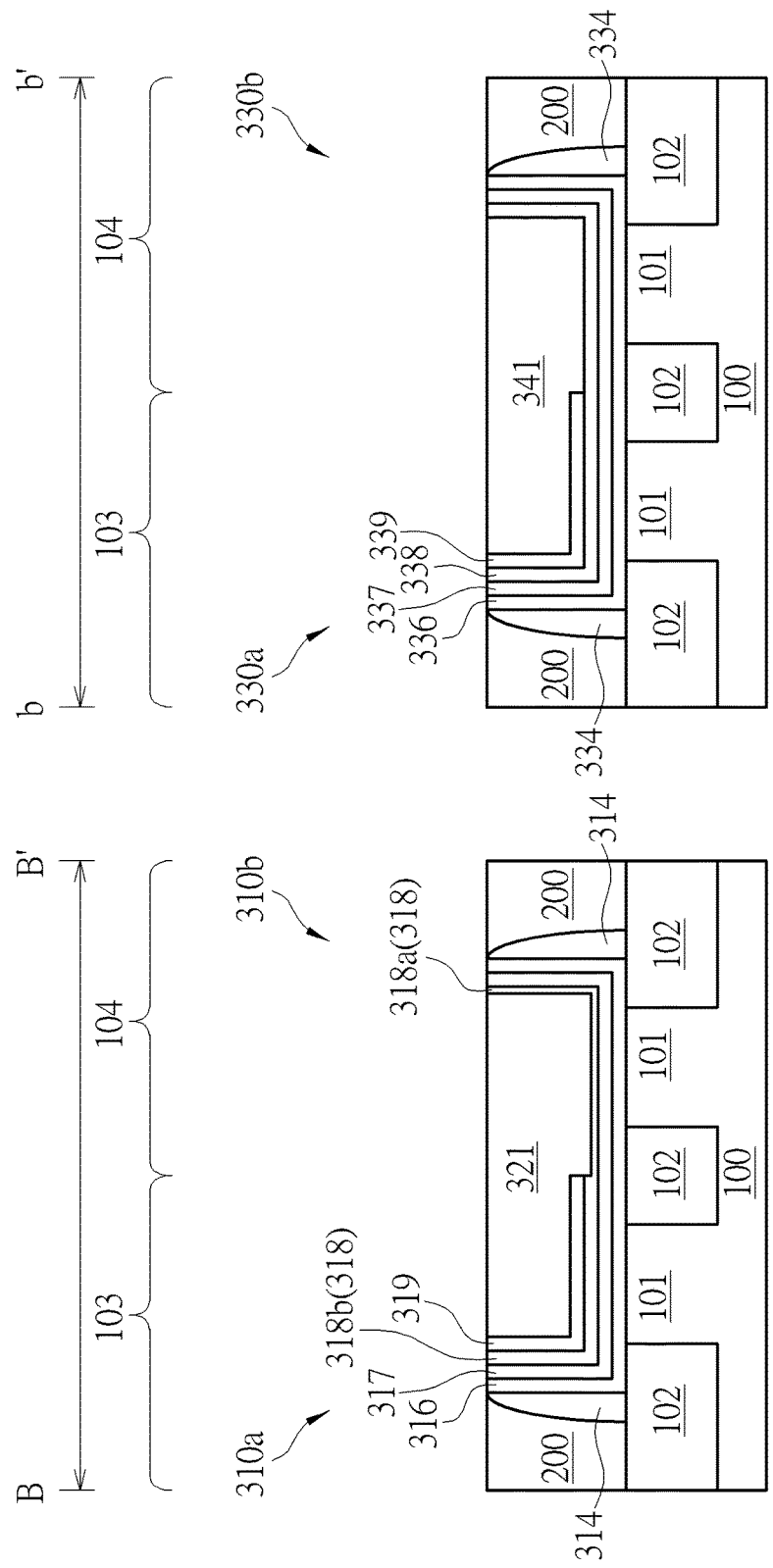

A planarization process, such as a chemical mechanical polishing process, may then be performed for forming a transistor structure shown in FIG. 9. It is worth noting that gate structures 310a, 310b, 330a, and 330b different from one another are formed at a left side of the gate trench 320, a right side of the gate trench 320, a left side of the gate trench 340, and a right side of the gate trench 340 respectively. The gate structure 310a disposed in the gate trench 320 and the transistor region 103 includes an interfacial layer (not shown, formed by the above-mentioned interfacial layer), a gate dielectric layer 316 (formed by the above-mentioned HK layer 106), a bottom barrier layer 317 (formed by the above-mentioned bottom barrier layer 107), a first work function layer 318b (formed by the above-mentioned work function layer 108b), a second work function layer 319 (formed by the above-mentioned work function layer 109), and a conductive layer 321 (formed by the above-mentioned low resistance material layer 110) sequentially stacked on a channel region (not shown). The gate structure 310b disposed in the gate trench 320 and the transistor region 104 includes an interfacial layer (not shown, formed by the above-mentioned interfacial layer), the gate dielectric layer 316 (formed by the above-mentioned HK layer 106), the bottom barrier layer 317 (formed by the above-mentioned bottom barrier layer 107), a thinned first work function layer 318a (formed by the above-mentioned thinned first work function layer 108a), and the conductive layer 321 (formed by the above-mentioned low resistance material layer 110) sequentially stacked on a channel region (not shown). The gate structure 330a disposed in the gate trench 340 and the transistor region 103 includes an interfacial layer (not shown, formed by the above-mentioned interfacial layer), a gate dielectric layer 336 (formed by the above-mentioned HK layer 106), a bottom barrier layer 337 (formed by the above-mentioned bottom barrier layer 107), a first work function layer 338 (formed by the above-mentioned first work function layer 108), a second work function layer 339 (formed by the above-mentioned second work function layer 109), and a conductive layer 341 (formed by the above-mentioned low resistance material layer 110) sequentially stacked on a channel region (not shown). The gate structure 330b disposed in the gate trench 340 and the transistor region 104 includes an interfacial layer (not shown, formed by the above-mentioned interfacial layer), the gate dielectric layer 336 (formed by the above-mentioned HK layer 106), the bottom barrier layer 337 (formed by the above-mentioned bottom barrier layer 107), the first work function layer 338 (formed by the above-mentioned first work function layer 108), and the conductive layer 341 (formed by the above-mentioned low resistance material layer 110) sequentially stacked on a channel region (not shown).

It is worth noting that the gate structure 330a and the gate structure 330b are surrounded by the same spacer 334, but the thickness of the work function layer in the gate structure 330a is different from the thickness of the work function layer in the gate structure 330b. For example, the work function layer of the gate structure 330a may be composed of the first work function layer 338 and the second work function layer 339, and the work function layer of the gate structure 330b may be composed of the first work function layer 338 only for having a relatively thinner work function layer. In addition, the gate structure 310a and the gate structure 310b are surrounded by the same spacer 314. The work function layer of the gate structure 310a may be composed of the first work function layer 318b and the second work function layer 319 for having a relatively thicker work function layer, and the work function layer of the gate structure 310b may be composed of the thinned first work function layer 318a only for being thinner than the work function layers of the gate structures 310a, 330a, and 330b. For example, the thickness of the work function layer of the gate structure 310b may range between about 5 angstroms and 7 angstroms, and may be 6 angstroms preferably. Additionally, it is worth noting that the first work function layer 318 in the gate structure 310a and the first work function layer 318 in the gate structure 310b are directly connected with each other and monolithically formed, but the thickness of the first work function layer 318 in the gate structure 310a is different from the thickness of the first work function layer 318 in the gate structure 310b.

The gate structures 310a, 310b, 330a, and 330b may be used to further form different transistor structures, and the threshold voltages of the channel regions of the transistor structures may be different from one another because of the stacked work function layers with different thicknesses. For example, the gate structure 310a and the gate structure 330a may be used to form N-type transistors with standard threshold voltage (SVT) in the subsequent processes, and the threshold voltage may be about 0.251 volt; the gate structure 330b may be used to form an N-type transistor with low threshold voltage (LVT), and the threshold voltage may be about 0.105 volt; and the gate structure 310b may be used to form an N-type transistor with ultra-low threshold voltage (uLVT), and the threshold voltage may be about 0.069 volt, but not limited thereto. In addition, the manufacturing method of N-type transistors with different threshold voltages is used to describe the exemplary condition in this embodiment, and it should be realized for those skilled in the related field that the present invention may also be used to form P-type transistors with different threshold voltages. Embodiments about the P-type transistors with different threshold voltages should be within the contemplated scope of the present invention.

The semiconductor device of the first embodiment in the present invention is then formed by the above-mentioned steps. In the present invention, the fluoride plasma and the patterned mask are employed in the treatment process for forming the non-volatile material layer in a part of the upper half portion of the work function layer. Subsequently, the gate structures in the same gate trench may have the work function layers with different thicknesses by removing the non-volatile material layer completely in the subsequent process. The transistors with the same conductivity type may have different threshold voltages accordingly, and transistors, such as an N-type transistor or a P-type transistor, with standard threshold voltage, low threshold voltage, or ultra-low threshold voltage in the semiconductor device may be formed accordingly.

However, it should be realized for those skilled in the related field that the semiconductor device in the present invention may also be formed by other methods and is not limited to the above-mentioned process steps. The following description will detail the different embodiments of the semiconductor device and the method of forming the same in the present invention. For making it easier to understand the differences between the embodiments, the following description will detail the dissimilarities among different embodiments and the identical features will not be redundantly described. Additionally, to simplify the description, identical components in each of the following embodiments are marked with identical symbols.

Figure 10:
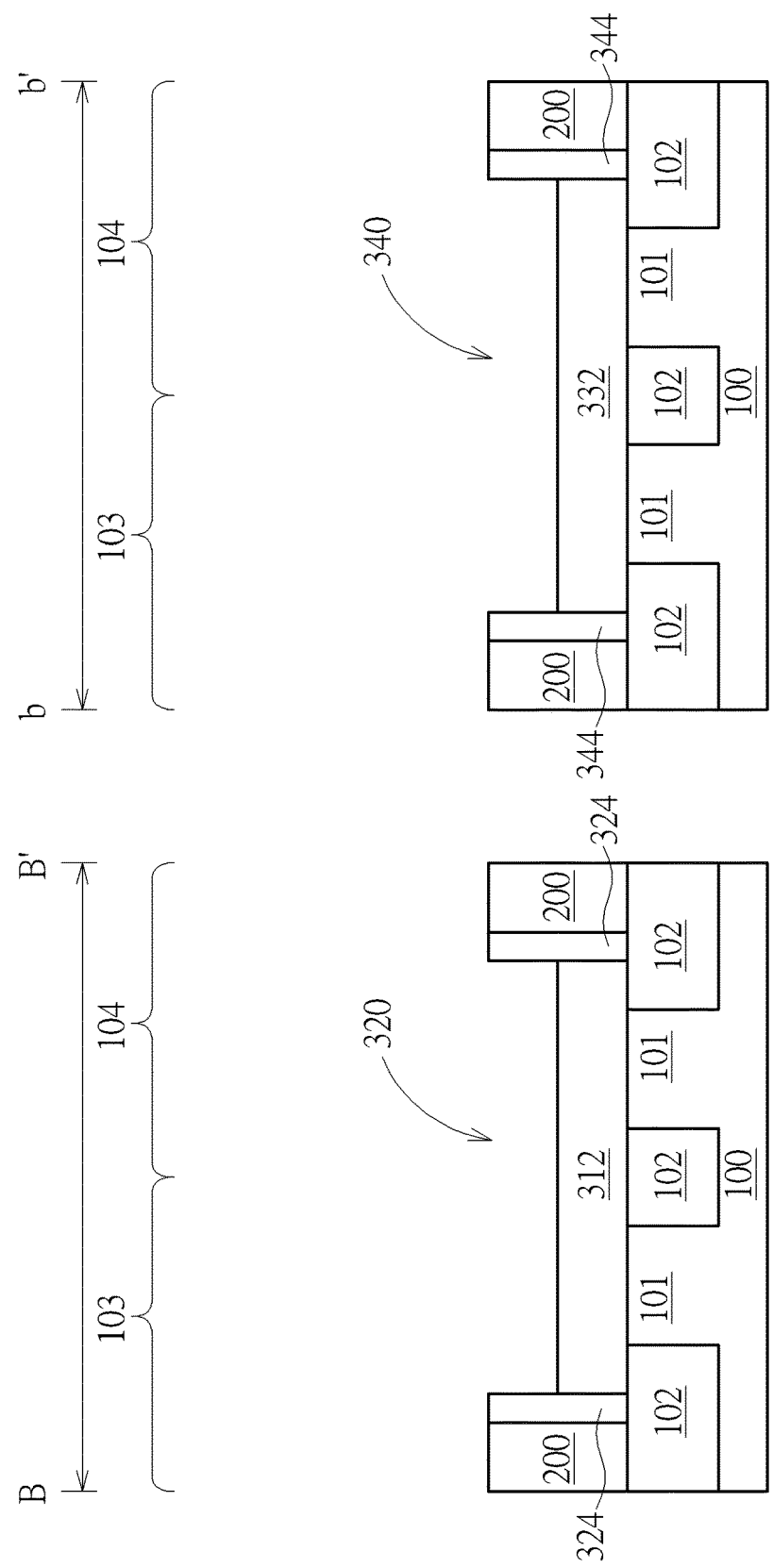

Please refer to FIGS. 10-13. FIGS. 10-13 are schematic cross-sectional diagrams illustrating a method of forming a semiconductor device according to a second embodiment of the present invention. In this embodiment, the method of forming the semiconductor device is substantially similar to the above-mentioned method described by FIGS. 1-4 in the first embodiment. The substrate 100 is provided, the gate structures 310 and 330 are formed straddling the active areas in the transistor regions 103 and 104, and a replacement metal gate process is then performed. The difference between this embodiment and the above-mentioned embodiment is that the dummy gate electrodes 312 and 332 are partially removed first in the step of removing the dummy gate electrodes 312 and 332 in this embodiment. Because the dummy gate electrodes 312 and 332 are partially removed only, the height of the dummy gate electrodes 312 and 332 may be lowered to about a half of the height of the spacers 324 and 344, which ranges between about 300 angstroms and 400 angstroms, for example, and upper half portions of the spacers 324 and 344 are exposed as shown in FIG. 10 accordingly. However, in another embodiment, it may be optional to form a sacrifice layer (not shown) partially filling the gate trenches 320 and 340 after the step of completely removing the gate structures 312 and 332, and the sacrifice layer covers the lower half portions of the spacers 324 and 344 only.

Figure 11:
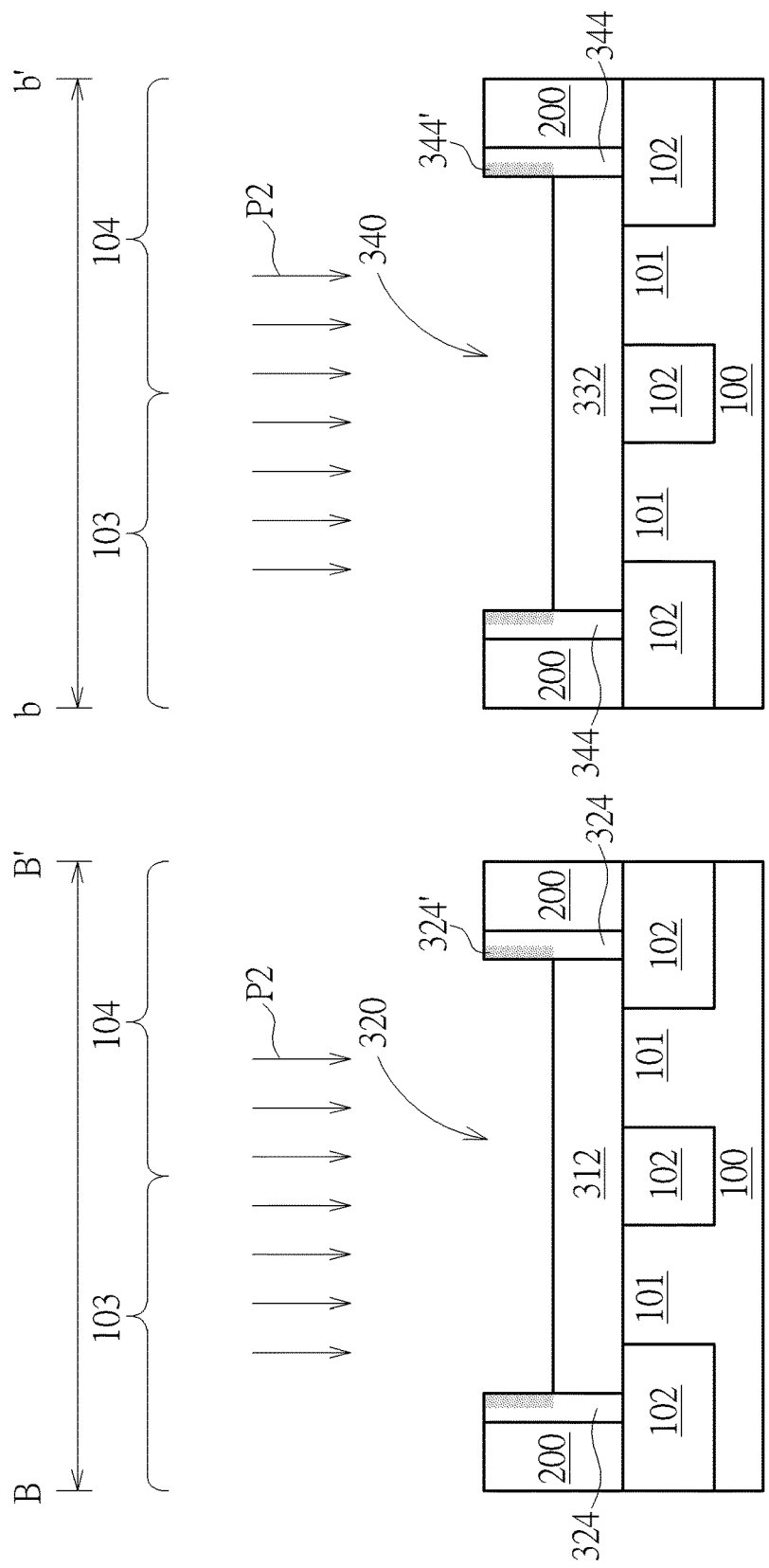
Figure 12:
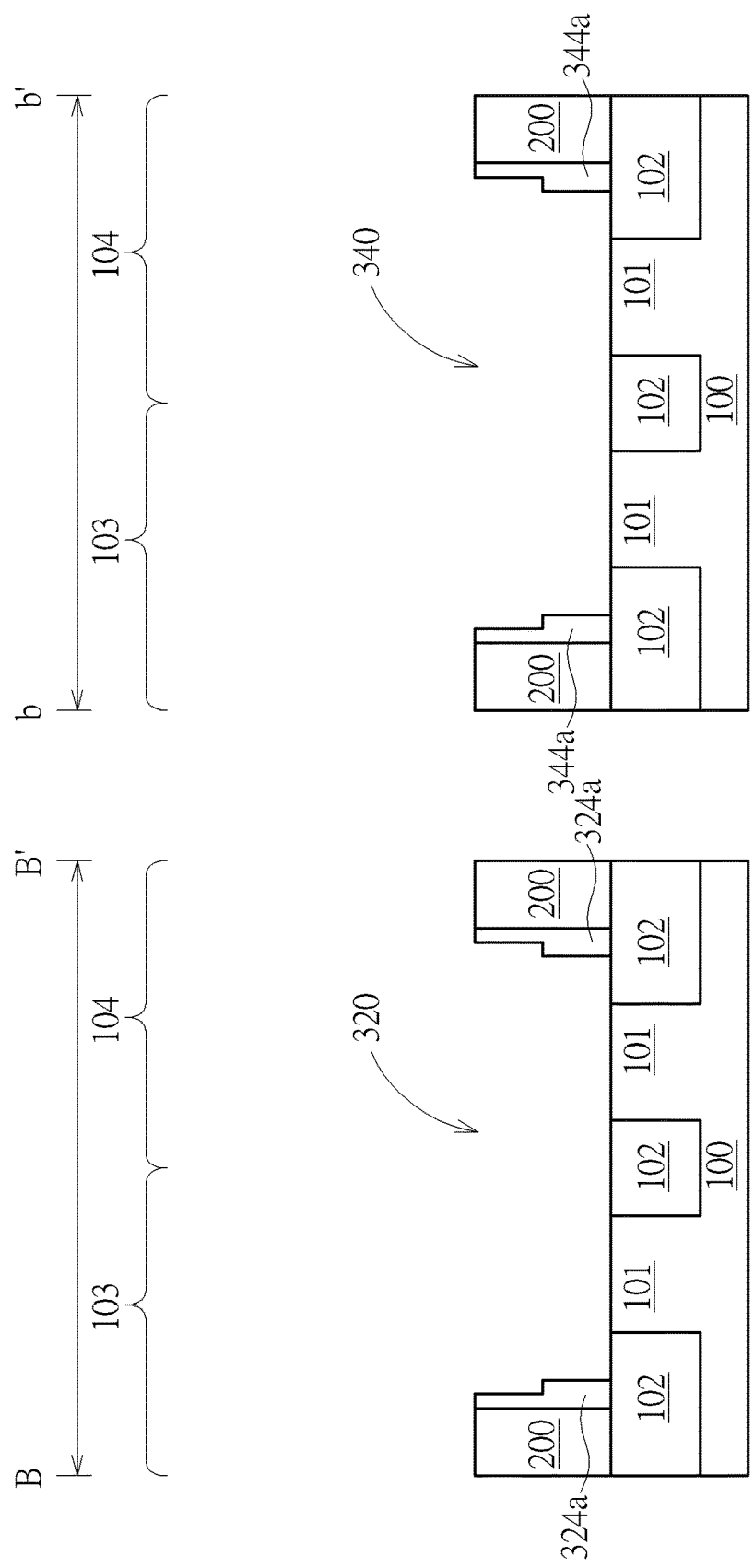

Subsequently, a part of the upper half portion of the spacer 324 and a part of the upper half portion of the spacer 344 are removed. The method of removing the spacers 324 and 344 may include the following steps. For example, a spacer treatment process P2, such as a oxidation process, may be performed first for partially oxidizing the upper half portions of the spacers 324 and 344 exposed from the dummy gate electrodes 312 and 332, and oxide layers 324' and 344' are formed as shown in FIG. 11. In one embodiment, the spacers 324 and 344 may include lower dielectric constant materials such as silicon oxycarbonitride (SiOCN), and removable materials may then be formed after the oxidation process. A dry etching process may then be performed. For example, dilute hydrofluoric acid (dHF) may be used to remove the oxide layers 324' and 344' so as to form ladder-shaped spacers 324a and 344a including a shoulder part as shown in FIG. 12.

Figure 13:
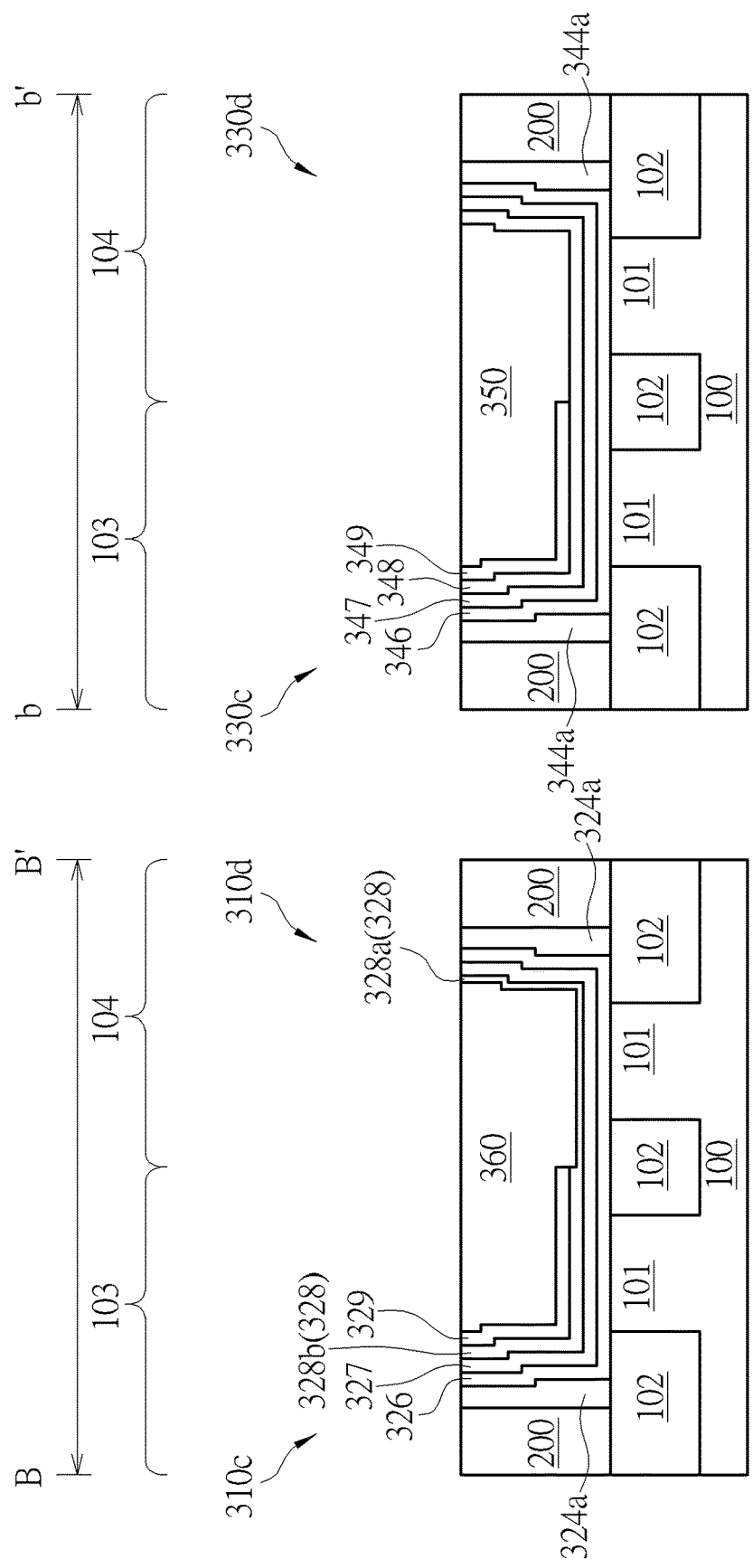

The dummy gate electrodes 312 and 332 are then completely removed, and the steps described in FIGS. 5-9 in the above-mentioned embodiment are performed subsequently for forming transistor structures as shown in FIG. 13. In this embodiment, gate structures 310c, 310d, 330c, and 330d different from one another may be formed at a left side of the gate trench 320, a right side of the gate trench 320, a left side of the gate trench 340, and a right side of the gate trench 340 respectively. The gate structure 310c disposed in the gate trench 320 and the transistor region 103 includes an interfacial layer (not shown), a gate dielectric layer 326, a bottom barrier layer 327, a first work function layer 328, a second work function layer 329, and a conductive layer 360 sequentially stacked on a channel region (not shown). The gate structure 310d disposed in the gate trench 320 and the transistor region 104 includes an interfacial layer (not shown), the gate dielectric layer 326, the bottom barrier layer 327, a thinned first work function layer 328, and the conductive layer 360 sequentially stacked on a channel region (not shown). Additionally, the gate structure 330c disposed in the gate trench 340 and the transistor region 103 includes an interfacial layer (not shown), a gate dielectric layer 346, a bottom barrier layer 347, a first work function layer 348, a second work function layer 349, and a conductive layer 350 sequentially stacked on a channel region (not shown). The gate structure 330d disposed in the gate trench 340 and the transistor region 104 includes an interfacial layer (not shown), the gate dielectric layer 346, the bottom barrier layer 347, the first work function layer 348, and the conductive layer 350 sequentially stacked on a channel region (not shown).

It is worth noting that the gate structure 330c and the gate structure 330d are surrounded by the spacer 344a having the shoulder part simultaneously, but the thickness of the work function layer in the gate structure 330c is different from the thickness of the work function layer in the gate structure 330d. For instance, the work function layer of the gate structure 330c may be composed of the first work function layer 348 and the second work function layer 349, and the work function layer of the gate structure 330d may be composed of the first work function layer 348 only for having a relatively thinner work function layer. In addition, the gate structure 310c and the gate structure 310d are surrounded by the same spacer 324a. The work function layer of the gate structure 310c may be composed of the first work function layer 328 and the second work function layer 329 for having a relatively thicker work function layer, and the work function layer of the gate structure 310d may be composed of the thinned first work function layer 328 only for being thinner than the work function layers of the gate structures 310c, 330c, and 330d. For example, the thickness of the work function layer of the gate structure 310d may range between about 6 angstroms and 7 angstroms. The channel regions of the gate structures 310c, 310d, 330c, and 330d may have different threshold voltages because of the work function layers with different thicknesses. For example, the gate structure 310c and the gate structure 330c may be used to form N-type transistors with standard threshold voltage, the gate structure 330d may be used to form an N-type transistor with low threshold voltage, and the gate structure 310d may be used to form an N-type transistor with ultra-low threshold voltage, but not limited thereto.

The semiconductor device of the second embodiment in the present invention is then formed by the above-mentioned steps. In the method of this embodiment, the upper half portions of the spacers 324 and 344 are removed first for expanding the opening size of the gate trenches 320 and 340; and the bottom barrier layer, the first work function layer, and the second work function layer stacked one over another sequentially are formed subsequently for improving process window (PW) in the processes of this embodiment in comparison with the embodiment mentioned above.

In the present invention, the non-volatile material layer with a uniform thickness is formed uniformly in a part of the upper half portion of the work function layer by the treatment process using the patterned mask and the fluoride plasma, and the non-volatile material layer is removed completely in the subsequent process. Accordingly, the relatively thinner work function layer may be further thinned in the present invention, and transistor structures of the same conductivity type may have different threshold voltages because of the work function layers with different thicknesses. The method of the present invention may be used to remove the upper half portion of the work function layer uniformly and conformally without completely removing the work function layer. The lower half portion of the work function layer may still be kept and become a thinned work function layer. Therefore, the method of the present invention may be used to form transistors, such as an N-type transistor or a P-type transistor, with standard threshold voltage, low threshold voltage, or ultra-low threshold voltage in the semiconductor devices.

Additionally, the manufacturing method of the planar transistors is used to describe the exemplary condition in the above-mentioned embodiments, and it should be realized for those skilled in the related field that the present invention may also be used to form other non-planar transistors, such as fin field effect transistors (FinFETs). For example, the method of the present invention may be used to form a uniform work function layer on a fin structure (not shown), and a thickness of a thinned work function layer may still have great uniformity and conformity after the step of removing the upper half portion of the work function layer. Therefore, there will not be a work function layer with a different thickness and a different shape formed on a specific portion of the fin structure, such as a top portion of the fin structure, because of the limitation generated by the shape of the fin structure. Embodiments about forming the work function layer on the fin structure should be within the contemplated scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor device, comprising:
providing a substrate, the substrate having a first region and a second region;
forming a barrier layer on the first region and the second region of the substrate;
forming a first work function layer on the barrier layer formed on the first region and the second region of the substrate;
forming a patterned photoresist layer covering the first work function layer on the second region of the substrate and exposing the first work function layer on the first region of the substrate;
converting an upper half portion of the first work function layer on the first region of the substrate into a non-volatile material layer, wherein the non-volatile material layer comprises a fluoride layer, and fluoride plasma is provided for performing a treatment process so as to form the fluoride layer, wherein the treatment process is performed after the step of forming the patterned photoresist layer, and the patterned photoresist layer covers the first work function layer on the second region during the treatment process;

removing the non-volatile material layer and keeping a lower half portion of the first work function layer on the first region of the substrate;

forming a work function material layer on the first work function layer on the second region of the substrate and the lower half portion of the first work function layer on the first region of the substrate; and removing the work function material layer on the first region for forming a second work function layer.

2. The method of forming the semiconductor device according to claim 1, wherein the fluoride layer comprises tantalum fluoride.

3. The method of forming the semiconductor device according to claim 1, wherein the first work function layer and the second work function layer have different conductivity types respectively.

4. The method of forming the semiconductor device according to claim 1, wherein the lower portion of the first work function layer has a thickness in the range of from 5 angstroms to 7 angstroms.

5. The method of forming the semiconductor device according to claim 1, further comprising:

forming a dielectric layer on the substrate, the dielectric layer having a gate trench, wherein the barrier layer and the first work function layer are both disposed in the gate trench.

* * * * *